United States Patent
Gustavsson et al.

(10) Patent No.: US 7,405,764 B2
(45) Date of Patent: Jul. 29, 2008

(54) MINIATURE CAMERA MODULE

(75) Inventors: Lars Gustavsson, Dacby (SE); Henrik Telander, Malmö (SE)

(73) Assignee: Digital Imaging Systems GmbH, Kirchheim/Teck-Nabern (DE)

( * ) Notice: Subject to any disclaimer, the term of this patent is extended or adjusted under 35 U.S.C. 154(b) by 993 days.

(21) Appl. No.: 10/417,317

(22) Filed: Apr. 16, 2003

(65) Prior Publication Data
US 2004/0189862 A1 Sep. 30, 2004

(30) Foreign Application Priority Data
Mar. 31, 2003 (EP) .................................. 03368025

(51) Int. Cl.
H04N 5/225 (2006.01)
H04N 17/00 (2006.01)

(52) U.S. Cl. ................... 348/374; 257/433; 348/187

(58) Field of Classification Search ............. 348/187, 348/188, 373–376; 257/433, 434, 680
See application file for complete search history.

(56) References Cited

U.S. PATENT DOCUMENTS

| | | | | |
|---|---|---|---|---|
| 4,991,007 | A * | 2/1991 | Corley | 348/188 |
| 5,047,260 | A * | 9/1991 | Durand | 427/508 |
| 5,781,351 | A * | 7/1998 | Murakami et al. | 359/808 |
| 5,998,867 | A * | 12/1999 | Jensen et al. | 257/729 |
| 6,424,843 | B1 | 7/2002 | Reitmaa et al. | |
| 6,427,078 | B1 | 7/2002 | Wilska et al. | |
| 6,476,417 | B2 | 11/2002 | Honda et al. | 257/59 |
| 6,480,346 | B2 * | 11/2002 | Funakoshi | 359/808 |
| 6,686,588 | B1 * | 2/2004 | Webster et al. | 250/239 |
| 7,030,926 | B2 * | 4/2006 | Miyake et al. | 348/340 |
| 7,158,170 | B2 * | 1/2007 | Gustavsson et al. | 348/187 |
| 7,215,374 | B2 * | 5/2007 | Why et al. | 348/374 |

| | | | | |
|---|---|---|---|---|
| 2002/0006687 | A1 * | 1/2002 | Lam | 438/118 |
| 2002/0044215 | A1 * | 4/2002 | Takagi et al. | 348/374 |

(Continued)

FOREIGN PATENT DOCUMENTS

EP 1081944 A2 3/2001

(Continued)

*Primary Examiner*—Lin Ye
*Assistant Examiner*—Timothy J. Henn
(74) *Attorney, Agent, or Firm*—Saile Ackerman LLC; Stephen B. Ackerman (57) ABSTRACT

Digital miniature cameras and methods to manufacture thereof have been achieved. Said miniature cameras having an adjustable focusing device are intended to be used as a built-in modules in hand-held consumer electronic devices, such as e.g. mobile phones and PDAs. The cameras invented have a very small size and produce high-quality pictures. Glue is used to hold different parts together and to seal the joints. The lens is glued in the final stage of the manufacturing line, thus providing the focus setting and the sealing of the cavity that covers the image sensor. A glob top is used to cover and seal the image processor. Said glob top serves two different purposes, first, to distribute the heat away from the sensor and, second, to lock the frame, together with the lens house, into a printed circuit board. In one embodiment a cavity PCB is used to "bury" the sensor of the camera, thus reducing the overall height required. In another embodiment the image processor is mounted on a flexistrip directly underneath the image sensor die, thus reducing the total height of the camera module.

27 Claims, 12 Drawing Sheets

U.S. PATENT DOCUMENTS

| | | | |
|---|---|---|---|
| 2002/0093585 A1* | 7/2002 | Lemstrom et al. | 348/374 |
| 2002/0167605 A1* | 11/2002 | Akimoto et al. | 348/374 |
| 2003/0002749 A1* | 1/2003 | Vehvilainen | 382/275 |
| 2003/0007084 A1* | 1/2003 | Nakjoh | 348/340 |
| 2003/0223008 A1* | 12/2003 | Kim et al. | 348/340 |
| 2004/0113047 A1* | 6/2004 | Tu | 250/208.1 |

FOREIGN PATENT DOCUMENTS

| | | |
|---|---|---|
| EP | 1180718 A1 | 2/2002 |
| WO | WO 0191193 A2 | 11/2001 |

\* cited by examiner

Glue the Image processor die — PCB

FIG. 13a

Bond Image proc

FIG. 13b

Mold the Image proc

FIG. 13c

Flip PCB and glue Image Sensor

FIG. 13d

Bond Image Sensor

FIG. 13e

1. Mount/Glue Lens holder
2. Mount/Glue Lens
3. Test Electrical/optical
4. Glue Lens barrel

FIG. 13f

1. Mount flexistrip
2. Electrical test flexistrip

FIG. 15c

MINIATURE CAMERA MODULE

RELATED PATENT APPLICATION

This application is related to U.S. patent application Ser. No. 10,434,743, filed on May 8, 2003, and assigned to the same assignee as the present invention.

BACKGROUND OF THE INVENTION (1) Field of the Invention

The present invention relates generally to digital cameras, and more particularly, to miniature cameras and manufacturing methods thereof used as built-in modules in hand-held consumer electronic devices as e.g. mobile phones or PDAs.

(2) Description of the Prior Art

Miniature cameras used in hand-held consumer electronic devices as e.g. mobile phones, PDAs have to be very small and light, the quality of their pictures has to be considerably high and their manufacturing costs very low. Small devices like this are very sensible to internal generated heat causing increased noise of the CMOS sensors used.

It is a challenge for the designers to achieve all these requirements. There are various patents in the field of miniature camera modules.

U.S. Pat. No. 6,476,417 (to Honda et al.) describes a semiconductor device for picking up an image including a lens-mounting unit provided with a lens for picking up an image; a semiconductor chip having a light-receiving element formed on a circuit-forming surface thereof, the light-receiving element converting light from the lens into an image signal; a flexible substrate provided between the lens-mounting unit and the semiconductor chip so as to supply the image signal to an external circuit; and a shading plate blocking light transmitting through the flexible substrate toward the semiconductor chip so as to substantially remove an influence of the light on the light-receiving element.

U.S. Pat. No. 6,424,843 (to Reitmaa et al.) discloses a telecommunication device comprising a speaker and a microphone in order to use the telecommunication device as a telephone. Further it comprises a camera having a certain photographing direction, and a display having a certain displaying direction, in order to use the telecommunication device as an image generating means. The photographing direction is substantially different from the displaying direction.

U.S. Pat. No. 6,427,078 (to Wilska et al.) shows a device for personal communication, data collection and data processing, which is a small-sized, portable and hand-held work station comprising a data processing unit, a display, a user interface, a number of peripheral device interfaces, at least one memory unit, a power source, preferably a battery, and an application software. According to the invention the device also comprises a camera unit. The camera unit comprises a camera, preferably a semiconductor camera, and optics connected thereto, which are placed in the housing of the device. Alternatively, the camera unit is fitted on a PCMCIA card, which can be connected to the PCMCIA card slot of the device. An object of the invention is also a PCMCIA card provided with a camera unit.

SUMMARY OF THE INVENTION

A principal object of the present invention is to achieve a camera device having a minimal size while producing high-quality pictures.

A further object of the present invention is to achieve a camera device having low manufacturing costs.

In accordance with the objects of this invention a miniature camera module having a very small size to be used as a built-in module in electronic devices has been achieved. Said camera comprises, first, a lens barrel comprising a housing, a lens system, and an IR-cut filter. Furthermore said camera module comprises a lens holder system comprising an adjustable focusing device, a glue reservoir, a glue groove, and a housing. Further Important parts are an image sensor chip having photon-receiving elements converting said photons into an image signal, a flexistrip, a printed circuit board (PCB) having a cavity wherein said image sensor chip is mounted, and an image processor.

In accordance with the objects of the invention a method to manufacture a miniature camera module having a very small size to be used as a built-in module in electronic devices has been achieved. Said method comprises, first, providing a flexistrip, a PCB having a cavity, an image sensor chip, an image processor, a lens barrel comprising a lens system and a IR-cut filter, and a lens holder system comprising an adjustable focusing device, a glue reservoir, and a housing. The first steps of said method are to mount PCB on flexistrip, to mount and glue the image sensor in cavity of PCB, to mount and glue image processor on PCB, and to wire-bond image processor and sensor to PCB. The following steps are to mount and glue lens holder on PCB, to put glob top on image processor, to mount and focus lens, to test camera module electrically and optically, and to glue the lens barrel.

In accordance with the objects of the invention a miniature camera module having a very small size to be used as a built-in module in electronic devices has been achieved. Said camera module comprises, first, a lens barrel comprising a housing, a lens system, and an IR-cut filter. Furthermore said camera module comprises a lens holder system comprising an adjustable focusing device, a glue reservoir, a glue groove, and a housing. More important parts of said camera module are an image sensor chip having photon-receiving elements converting said photons into an image signal, an image processor, a flexistrip on which said image processor is mounted, and a printed circuit board (PCB) on which said image sensor chip is mounted.

In accordance with the objects of the invention a method to manufacture a miniature camera module having a very small size to be used as a built-in module in electronic devices has been achieved. Said method comprises, first, providing a flexistrip, a PCB, an image sensor chip being mounted on said PCB, an image processor being mounted on a flexistrip underneath said image sensor, a lens barrel comprising a lens system and a IR-cut filter, and a lens holder system comprising an adjustable focusing device, a glue reservoir, and a housing. The first steps of said method invented comprise to mount PCB on flexistrip, to mount and glue image processor die on flexistrip, to wire-bond image processor to flexistrip, to mount and glue plastic boarder on flexistrip, and to fill plastic boarder with glob top. The following steps are to flip PCB and mount and glue image sensor on PCB, to wire-bond image sensor to PCB, to mount and glue lens holder on PCB, to mount lens barrel and focus lens, to test camera module electrically and optically, and to glue lens barrel finally.

In accordance with the objects of the invention an alternative method to manufacture a miniature camera module having a very small size to be used as a built-in module in electronic devices has been achieved. Said method comprises, first, providing a flexistrip having integrated plastic boarders, a PCB, an image sensor chip being mounted on said PCB, an image processor being mounted on a flexistrip underneath said image sensor, a lens barrel comprising a lens system and a IR-cut filter, and a lens holder system comprising an adjustable focusing device, a glue reservoir, and a housing. The first steps of the method invented are to mount a PCB on a flexistrip having integrated plastic boarder, to mount and glue image processor die on flexistrip within said plastic boarder, to wire-bond image processor to flexistrip, and to fill plastic boarder with glob top. The following steps are to flip PCB and mount and glue image sensor on PCB, to wire-bond image sensor to PCB, to mount and glue lens holder on PCB, to mount lens barrel and focus lens, to test camera module electrically and optically, and to glue the lens barrel into the lens holder finally.

In accordance with the objects of the invention another alternative method to manufacture a miniature camera module having a very small size to be used as a built-in module in electronic devices has been achieved. Said method comprises, first, providing a flexistrip, a PCB, an image sensor chip being mounted on said PCB, an image processor being mounted on a flexistrip underneath said image sensor, a lens barrel comprising a lens system and a IR-cut filter, and a lens holder system comprising an adjustable focusing device, a glue reservoir, and a housing. The first steps of said method invented comprise to glue image processor die on a PCB, to wire-bond an image processor to said PCB, to mould image processor die inside a plastic boarder using glob top and to flip PCB and mount and glue image sensor on PCB. The following steps comprise to wire-bond image sensor to PCB, to mount and glue lens holder on PCB, to mount and glue lens into lens barrel and to mount the lens barrel into the lens holder and focus lens. The last sequence of steps comprise to perform electrical and optical tests, to glue lens barrel to lens holder, to mount flexistrip on bottom side of PCB, and, finally to test camera module electrically and optically.

BRIEF DESCRIPTION OF THE DRAWINGS

In the accompanying drawings forming a material part of this description, there is shown:

FIG. 6a to 6f illustrate major manufacturing process steps for the first embodiment of the camera module invented.

FIG. 9a to 9h illustrate major manufacturing process steps for the second embodiment of the camera module invented.

FIG. 11a to 11d illustrate alternative major manufacturing process steps for the second embodiment of the camera module invented.

FIG. 13a to 13g illustrate another alternative major manufacturing process steps for the second embodiment of the camera module invented.

FIG. 15a to 15c illustrates different methods how to move and fasten the lens barrel during the focusing process.

DESCRIPTION OF THE PREFERRED EMBODIMENTS

The preferred embodiments disclose miniature camera modules and manufacturing methods thereto for embedding photo imaging and video capabilities into mobile phones and PDAs.

The miniature cameras invented, having an adjustable focusing device, are intended to be used as built-in modules in hand-held consumer electronic devices. The cameras are fix-focus cameras; the lens is focused during the manufacturing process.

Optical devices have to be focused to get the optimal performance. This is achieved by moving the lens relatively to the image plane. In a preferred embodiment the height of the total device will differ by ±0.2 mm due to the shifting of the lens to a achieve the system focused.

Figure 1:
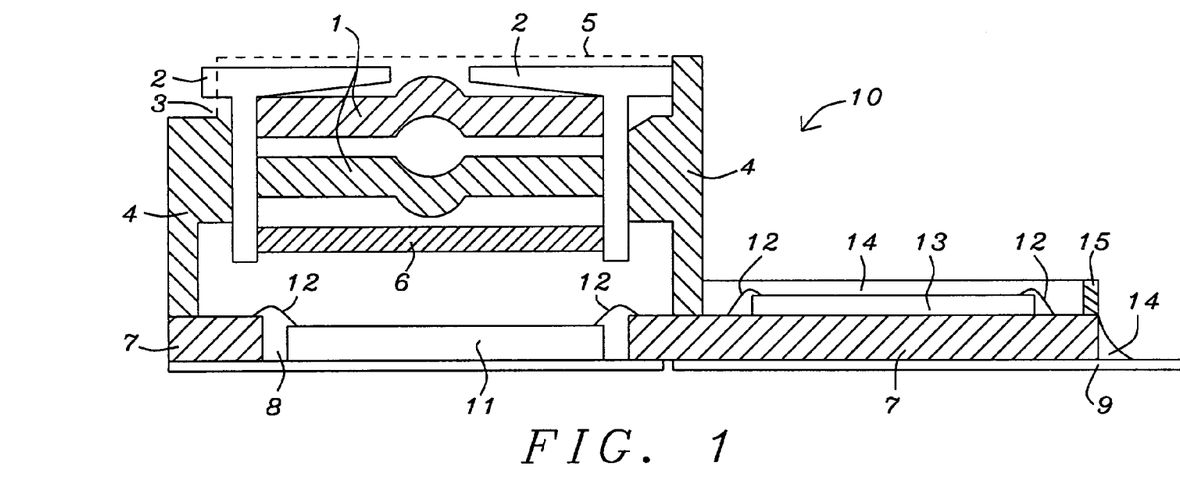
FIG. 1 shows a cross section of a first embodiment of the camera invented.

FIG. 1 shows a preferred embodiment of the camera module 10 invented. Said camera comprises a lens system 1 which is fastened in a lens barrel 2. Optical devices have to be focused to get the optimal performance. This is achieved by moving the lens system 1 relatively to the image plane. In a preferred embodiment the height of the camera module would differ by ±0.2 mm due to the focusing operation. The lens holder 4 is designed to keep a fixed height of the camera module. A rim 5 is provided at the top of the lens holder 4 in order to ensure that a lens grip is reachable even if the lens is turned into its innermost position.

Said lens system 1 can be focused during the manufacturing process by moving the lens barrel 2 along the optical axis until the best focus position is reached. The details of said movement will be explained later.

In order to produce camera modules in the required small dimensions glue is a favourable means to hold different parts together and to seal the joints A glue groove 3 is provided around the lens barrel 2 in direct connection with said thread. This ditch will direct the glue to said thread so that the thread connection will be covered totally.

Said lens barrel 2 is holding additionally an infrared (IR)-cut filter IR 6. Said IR-cut filter is used to filter out infrared radiation while transmitting the visible rays from the light source, thus preventing excessive heat build-up within the camera module.

The optical components are the dominant part of the overall height in a camera module. Thus the optical design has to compromise and optimize an acceptable mix of overall height for the module and the picture quality. The image sensor and its PCB-carrier, will represent the rest. Reducing the height of said rest will reduce the overall height without loosing picture quality.

Said reduction of the overall height can be achieved by combining the sensor and the PCB. This has been achieved by a special design of a cavity board, where the cavity 8 of the PCB 7 is used to "bury" the sensor 11. The gain of height reduction is the height of Said PCB 7 is mounted on a flexistrip 9. A flexistrip is a flexible self-supporting strip and is formed of a homogeneous mix of the blended metallic particles. The electrical connections between the image sensor 11 and the PCB 7 and between said PCB 7 and the image processor 13 are provided by bonding wires 12. A strain relief 15 is provided to fix the camera module on the flexistrip 9.

A glob top 14 is put on top of said image processor 13. A glob top is the application of an encapsulant to protect microelectronics from environmental, mechanical and electrical damage. Such a glob top is used to cover and seal the image processor 13. Said image processor is placed close to the image sensor. A plastic frame 15 shapes and limits the glob top. Said frame is a part of the lens holder. The material of the glob top can be silicon-based resin or epoxy-based.

Figure 2:
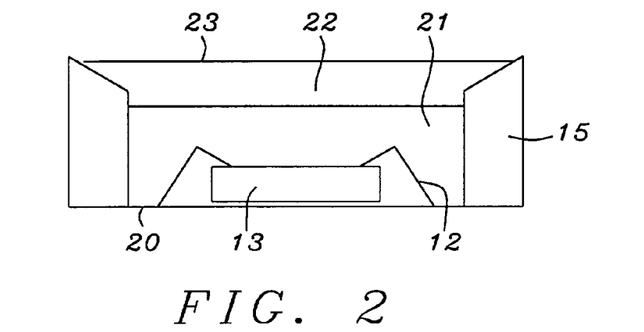
FIG. 2 shows a flowchart of the method of gluing different parts of the camera together.
Figures 3, 4:
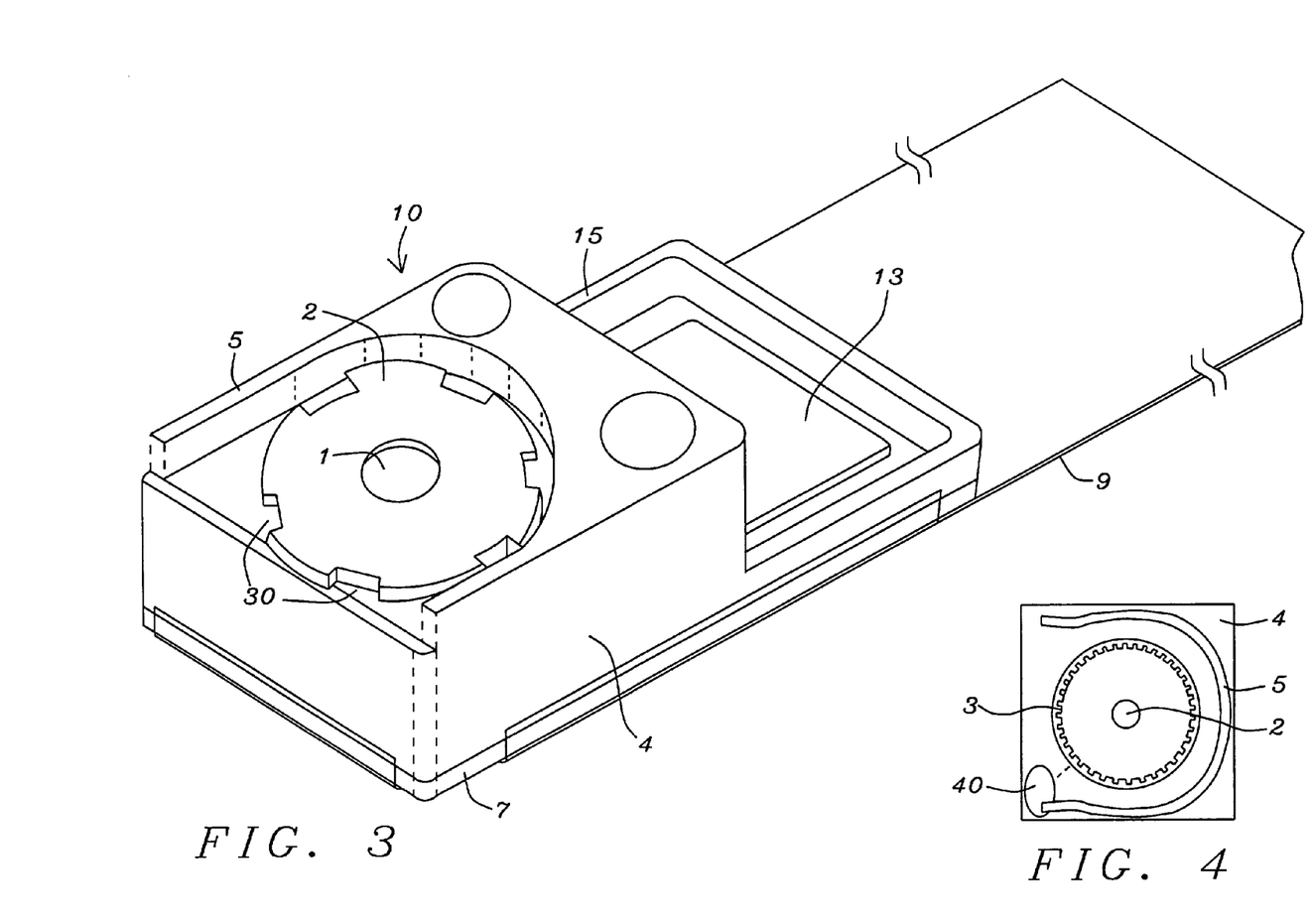
FIG. 3 shows a general view of the first embodiment of the camera invented.
FIG. 4 illustrates the mechanism to handle the glue used to fasten the lens barrel.

Said glob top serves three different purposes. First, to reduce the internal heating, the glob top distributes the heat, generated by the image processor, away from the sensor. Second, the glob top locks the frame together with the lens house into the PCB and thus it will be impossible to open the module without destroying the device. Third, the glob top provides an electro-magnetic interference (EMI) shield. FIG. 2 shows the details. The surface of the PCB board is signified by 20, the plastic boarder of the image processor is signified by 15, the image processor by 13, bonding wires 12 connect said image processor 13 with the said PCB 20. The glob top is applied in two layers. The bottom layer 21 is a non-conductive material; the top layer 22 is made out of conductive material and provides an EMI-shield. The top glue level is represented by 23. The inner rim of said plastic boarder is made lower than the outer rim. The glob top covers the inner rim and locks said parts together FIG. 3 shows a general view of an alternative preferred embodiment of the camera module 10 invented. In this general view it shows the lens barrel 2, the lens holder 4, the rim 5, the PCB board 7, the flexistrip 9, the plastic frame 15 as part of the lens holder 4, and the image processor 13 as described above. Dents are provided 30 at the upper rim of the lens barrel 2. These dents 30 can be used by a lens grip to move said lens system contained in the lens barrel 2 into the focus position during the manufacturing process. The design of said dents 30 can vary with the type of lens barrels used.

CMOS image sensors are sensitive to radiation of many kinds. The housing material of the camera module has to be selected to block out or to reduce significantly the negative effects caused by light, infrared and other radiation. It is also important to use a material that can reduce electro-magnetic interference (EMI). This is achieved by using metal or a polymer that contains metal and/or magnetite.

FIG. 4 shows a simplified top view of the camera module invented. It shows a lens holder 4, a lens barrel 2, said rim 5, said glue groove 3, and a glue reservoir 40. The functions of said glue groove and glue reservoir will be explained more below. The lens holder 4 is designed to keep a fixed height of the module, compensating said difference of height caused by focusing, using rim 12 on top of the lens holder 10. An additional cover glass can be added to the camera module. Said cover glass can be fastened by a simple snap-in operation into the rim on top of the lens barrel. A lens grip is used to move said lens barrel into focused position. Said lens grip has to be reachable even if the lens is turned into its innermost position. Additionally said rim 5 serves as a contact surface for an optional cover glass. Said cover glass, protecting the lens system and the lens barrel 2 of the camera, can be added to the module (snap-in cover) without any modification of the basic camera module. Said rim 5 serves as a contact surface for this optional cover glass.

Figure 15A:
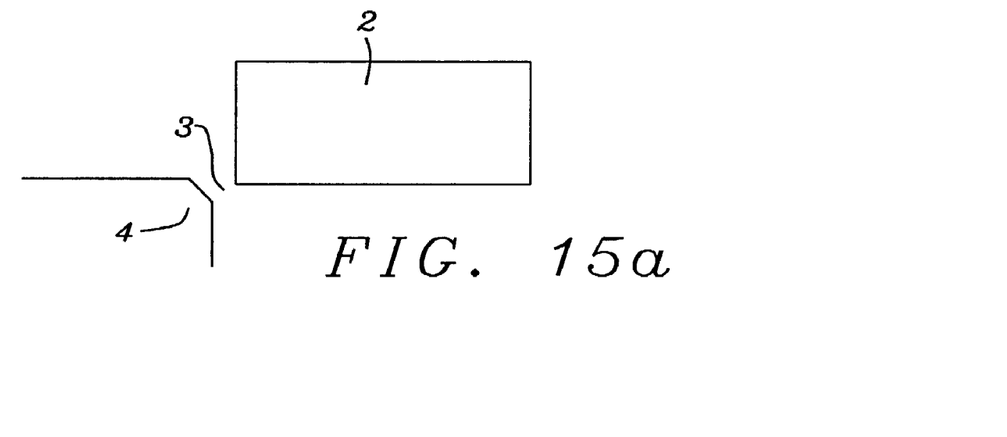
Figure 15B:
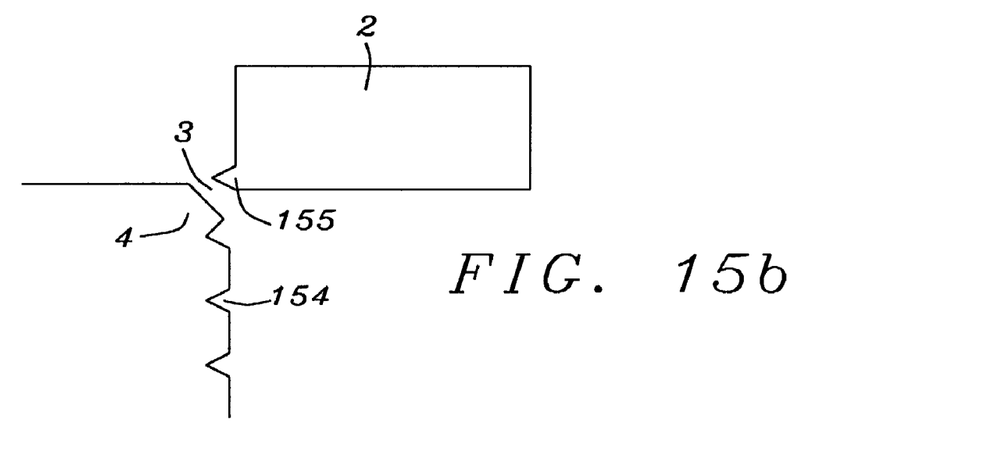
Figure 15C:
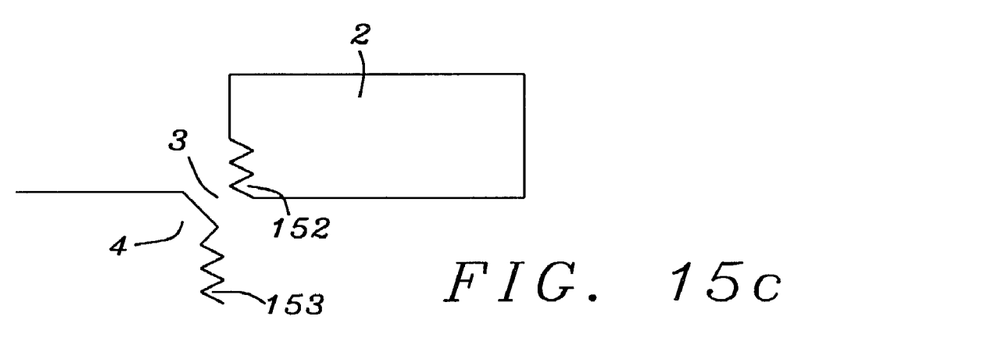

Referring now to FIG. 15a, b c different methods are illustrated how said lens barrel 2 can be moved into the focus position and can be fastened in the focus position.

In the U.S. patent application Ser. No. 10,434,743, filed on May 8, 2003, a system has been described which can focus a miniature camera as presented in this invention. Said system has a replaceable lens grip matching said dents of the lens barrel described in the present invention.

FIG. 15a illustrates a free adjustable lens barrel 2, glue groove 3 and lens holder 4. A lens grip is moving said lens barrel into focus position and holds the lens barrel until the glue is cured.

FIG. 15b illustrates a lens barrel 2 having a snap-in function, a glue groove 3 and a lens holder 4 having dents 154 in which the which said lens barrel 2 can snap-in. Said lens barrel 2 has an counter-piece 151 projecting outwards matching said dents 154. A lens grip is moving said lens barrel 2 into focus position, glue is applied, said dents 154 and the counter-piece 131 are holding the lens barrel 2 in focus position until the glue is cured. In this case said lens grip has not to hold the lens barrel 2 in the focus position until the glue is cured.

FIG. 15c illustrates a lens barrel 2 having threads 132, a glue groove 3 and a lens holder 4 having threads 153 in which the which said lens barrel 2 can be turned by a lens grip and can thus be moved along the optical axis. A lens grip is moving said lens barrel 2 into focus position by turning the lens barrel 2, glue is applied, said threads 152 and 153 are holding the lens barrel 2 in focus position until the glue is cured. In this case said lens grip has not to hold the lens barrel 2 in the focus position until the glue is cured.

In order to produce devices in the small dimensions required glue is used to hold different parts together and to seal the joints. The application of glue, together with the curing time required, must be fast to secure that the production time will be short and the manufacturing costs kept at a low level.

Figure 5:
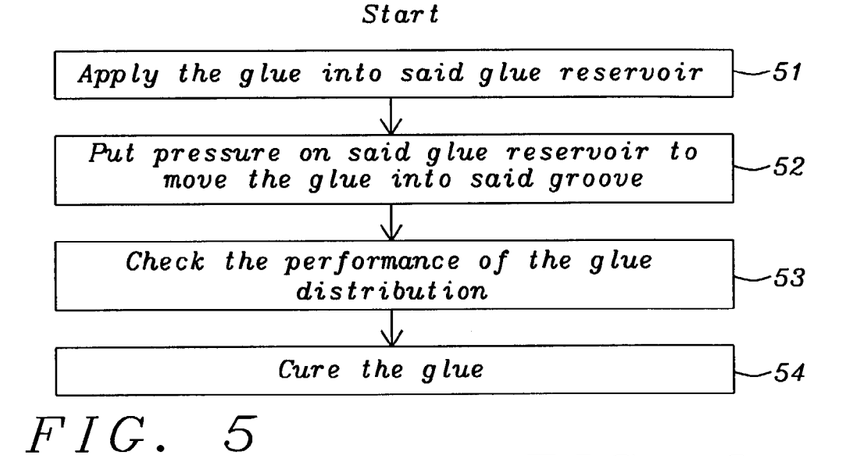
FIG. 5 shows a flowchart of the method to glue the lens barrel.

The lens holder 4, shown in FIG. 1 to 4, has been designed in a special way to speed up the gluing process and to assure that the glue will fill the threads to 100%. FIG. 5 shows the major steps of a method to fasten the lens onto the lens holder using glue. In the first step 51 the glue is applied into a glue reservoir 40 as shown in FIG. 4. In the second step 52 pressure is put on said glue reservoir to move the glue out of the reservoir into a glue groove 3 provided. Said glue groove is directly connected with said glue reservoir 40 and with threads wherein the lens barrel is fastened. Said groove 3 has been shown in FIG. 1 and FIG. 4. Said groove 3 will direct the glue to the threads so that 100% of the thread connection will be covered. The low viscosity of the glue used will guarantee that the threads are sealed properly. The actual application of the glue has not to be precise but has to be performed in a short time.

In the following step 53 the performance of the glue distribution is checked using a simple vision system. The check is limited to detecting any potential glue rests in the reservoir. The glue has to be colored to do this. In the last step 54 UV-light cures the glue fastening the lens. A visual test can be performed by a vision system, which means that a camera inspects the glue reservoir.

Figure 6A:
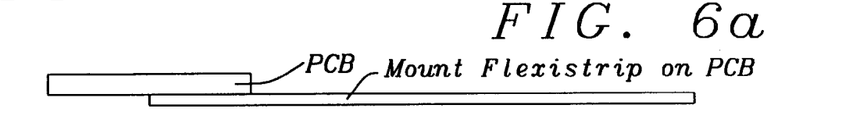
Figure 6B:
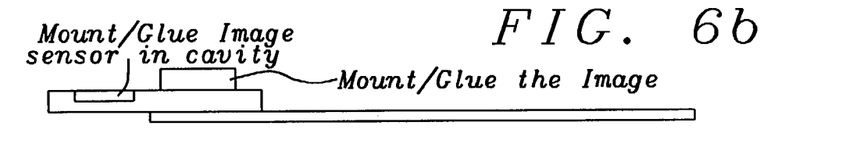
Figure 6C:
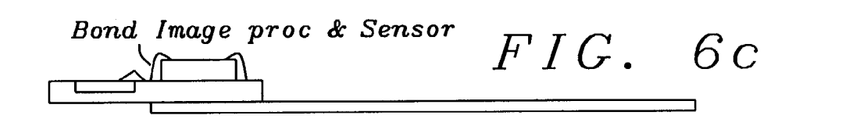
Figure 6D:
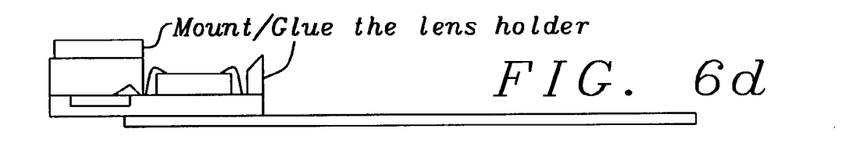
Figure 6E:
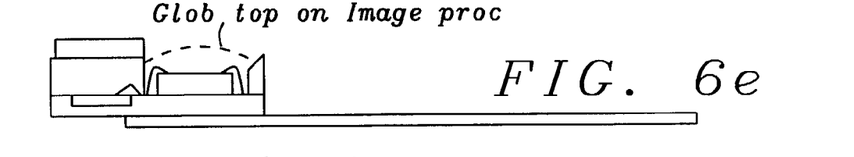
Figure 6F:
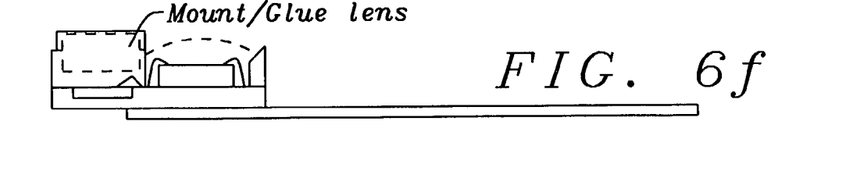

FIG. 6a to f illustrate major steps of a method to manufacture the preferred embodiment of the invention described above. FIG. 6a describes how a cavity PCB is mounted on a flexistrip. FIG. 6b shows the how a image sensor is mounted and glued into the cavity of said PCB and how an image processor is mounted and glued on said PCB close to said image sensor. FIG. 6c illustrates the wire bonding of the image processor and the image sensor. FIG. 6d shows the mounting and gluing of a lens holder. FIG. 6e shows the application of the glob top sealing the image processor. FIG. 6f shows how the lens is mounted and glued after the focusing process.

Figure 7:
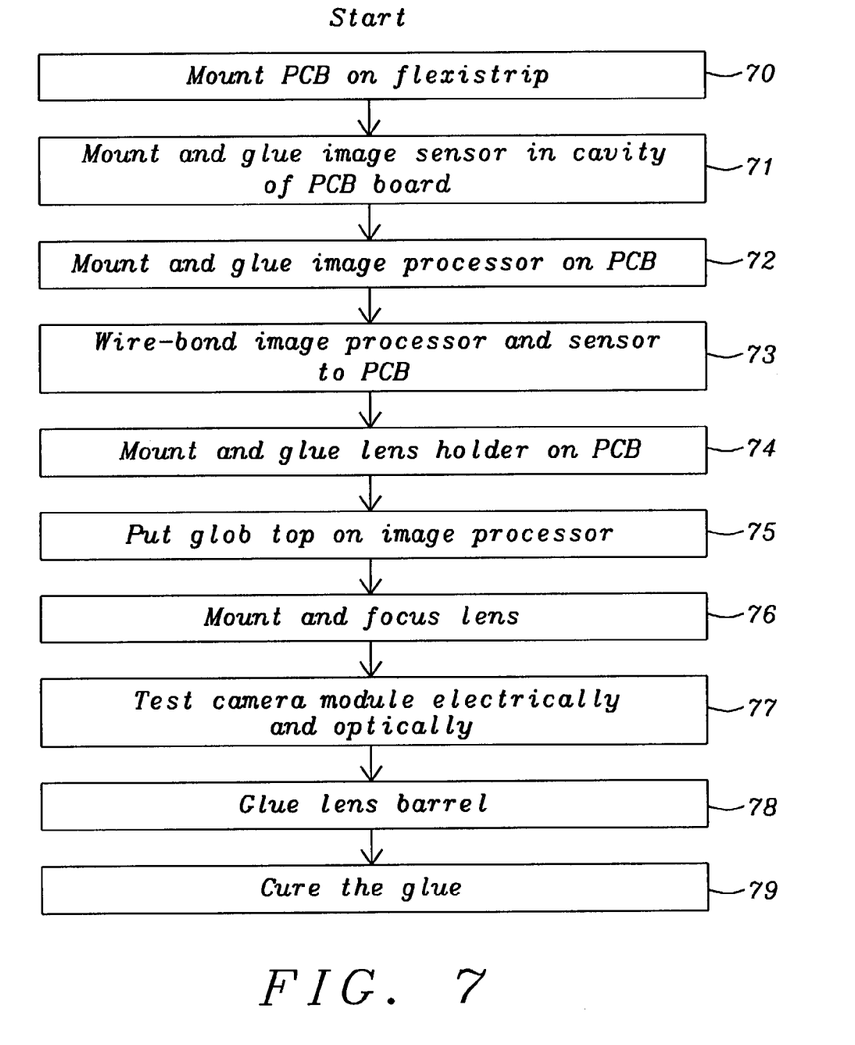
FIG. 7 shows a flowchart of a method to manufacture the first embodiment of the camera module invented.

FIG. 7 shows a flowchart of a preferred method to manufacture said miniature camera module. The first step 70 is to mount a PCB on a flexistrip, the next step 71 is to mount and glue an image sensor into a cavity of said PCB, followed by mounting and gluing an image processor on said PCB in step 72. Now said image processor and image sensor is wire-bonded to the PCB board in step 73. Next step 74 is to mount and glue a lens holder on the PBC. In the following step 75 a glob top is put on the image processor. Step 76 comprises the mounting and focusing of the lens built in a lens barrel. Said lens barrel is holding an IR-cut filter additionally. The next step 77 comprises the electrical and optical tests of the camera module, then said lens barrel is glued to the lens holder in step 78, followed by the last step 79 in which the glue is cured.

Steps 76, 77, and 78 can be performed by a test system as described in patent application Ser. No. 10,434,743, filed on May 8, 2003.

Figure 8:
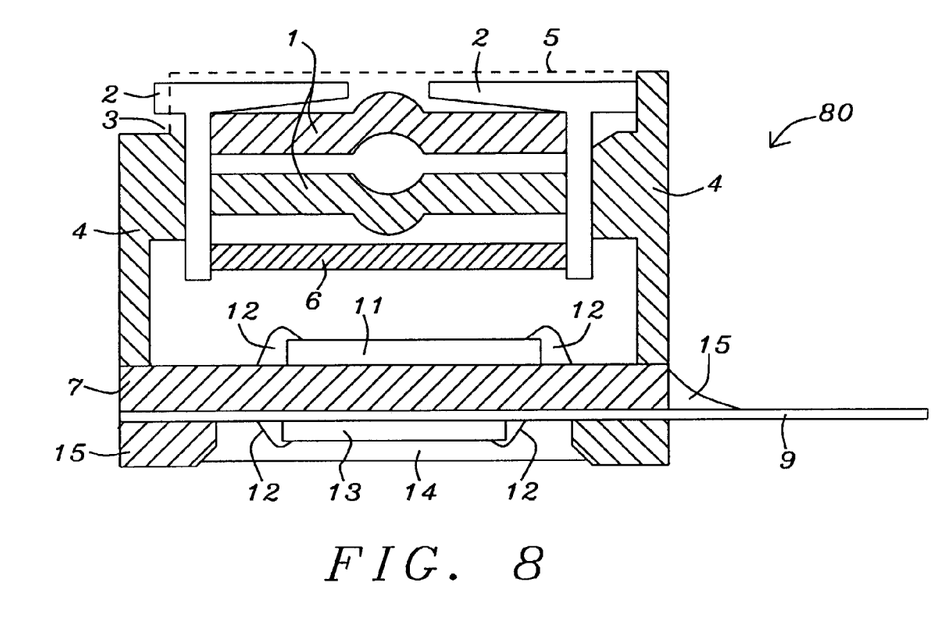
FIG. 8 shows a cross section of a second embodiment of the camera invented.

FIG. 8 shows a second embodiment 80 of the camera modules invented. Said second embodiment has the shape of a cube. The main difference to the embodiment described above is that the image processor is mounted directly on a flexistrip using an integrated boarder. In this embodiment the image processor is very close to the image sensor.

The basic structure of the upper part of the second embodiment is the same compared to the first embodiment. This includes the lens system 1, the lens barrel 2, the glue groove 3, the lens holder 4, the rim 5, and the IR-cut filter 6. In the second embodiment 80 the image sensor 11 is mounted on a PCB 7. The image processor 13 is mounted directly underneath the image sensor 11 on a flexistrip 9. A glob top 14 is protecting the image processor 13. A plastic frame or boarder 15 shapes and limits said glob top 14. Wire-bonds 12 are connecting the image sensor to the PCB 12 and the image processor 13 to the flexistrip. A strain relief 15 is provided to fix the camera module on the flexistrip 9.

Figure 9A:
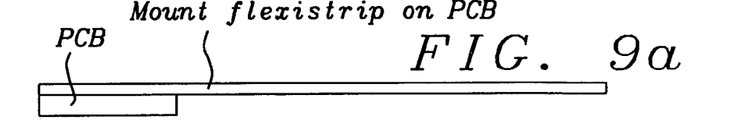
Figure 9B:
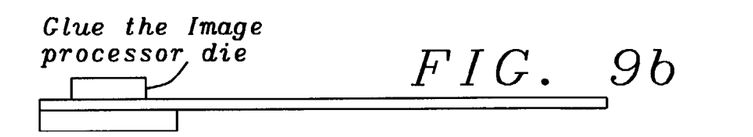
Figure 9C:
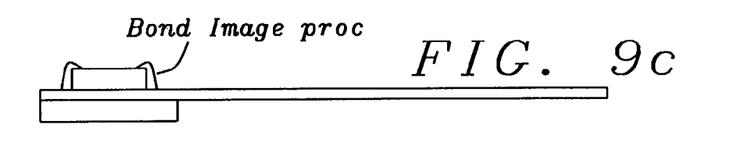
Figure 9D:
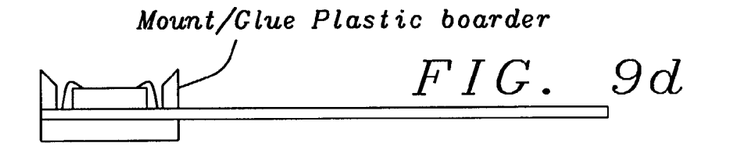
Figure 9E:
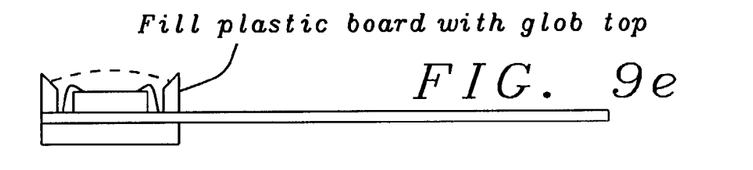
Figure 9F:
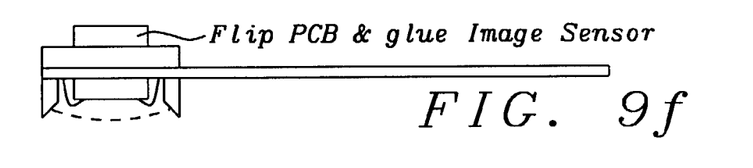
Figure 9G:
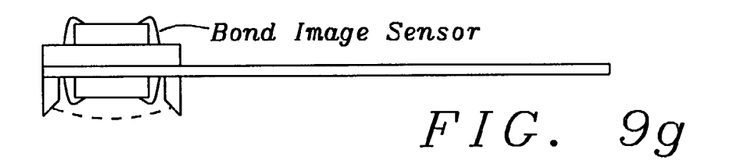
Figure 9H:
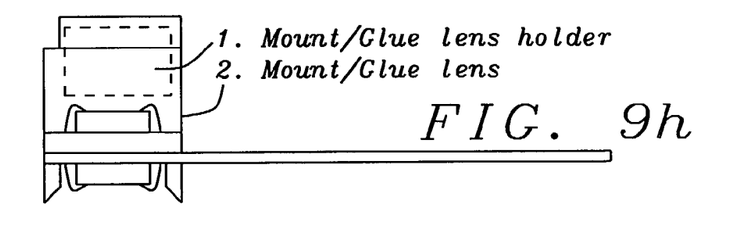

FIG. 9a to h illustrate major steps of a method to manufacture the preferred embodiment of the invention described above. FIG. 9a illustrates how a flexistrip is mounted on a PCB. FIG. 9b shows how an image processor die is mounted and glued on the flexistrip on the opposite side of the PCB. FIG. 9c demonstrates how said image processor die is wire-bonded to the flexi-strip. FIG. 9d shows how a plastic boarder is mounted around the image processor and glued on the flexistrip. FIG. 9e shows how said plastic boarder is filled with a glob top. FIG. 9f demonstrates how the PCB and flexistrip is flipped and an image sensor die is mounted and glued on the PBC. FIG. 9g illustrates how the image sensor die is electrically connected through wire-bonds to the PCB. FIG. 9h shows how, first, a lens holder is mounted and glued on the PCB, and then a lens barrel is mounted and glued into the lens holder.

Figure 10:
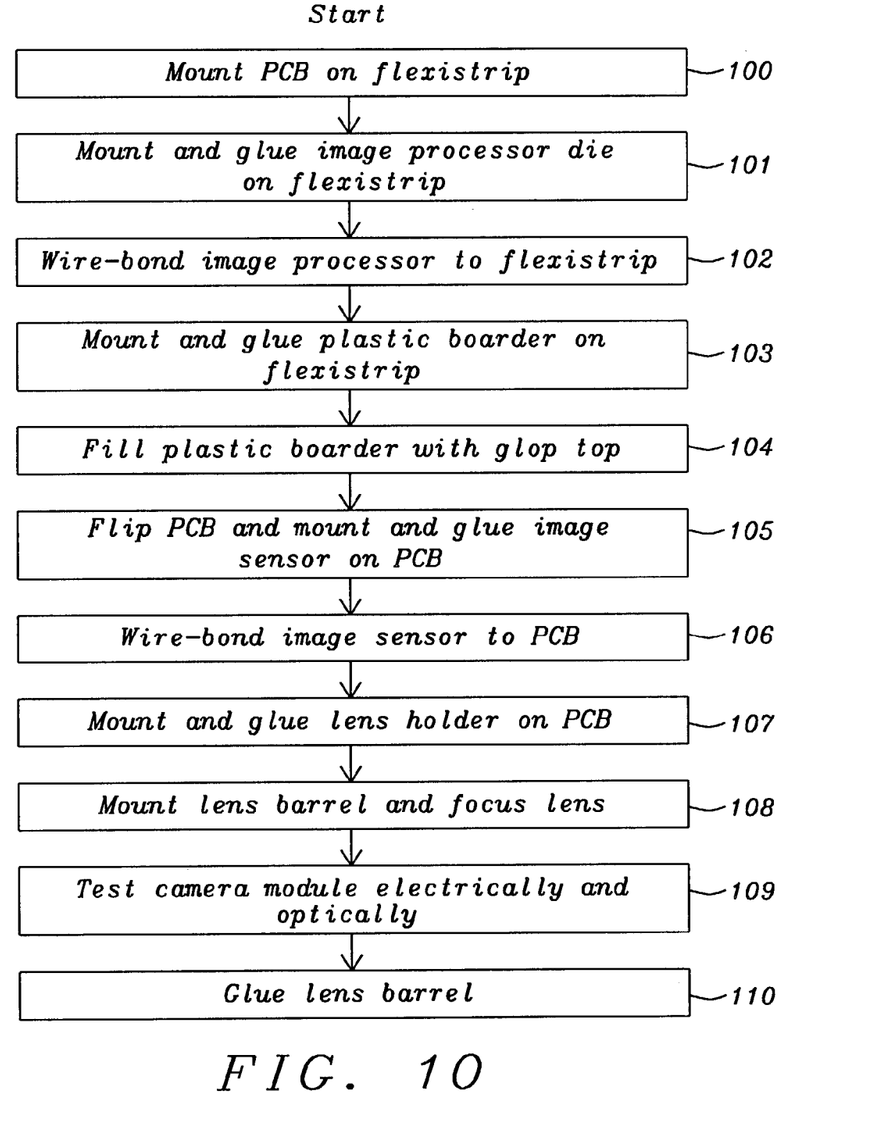
FIG. 10 shows a flowchart of a method to manufacture the second embodiment of the camera module invented.
Figure 11A:
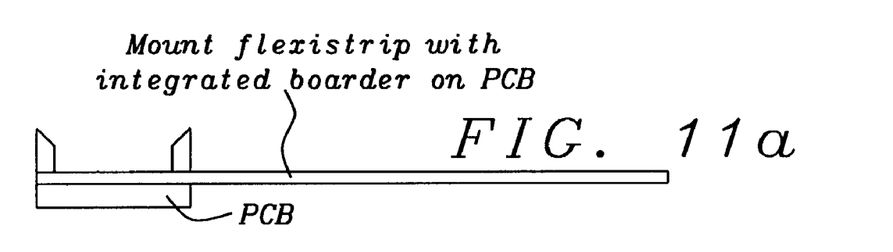
Figure 11B:
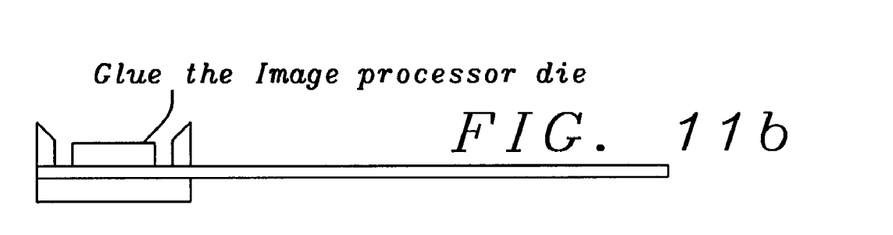
Figure 11C:
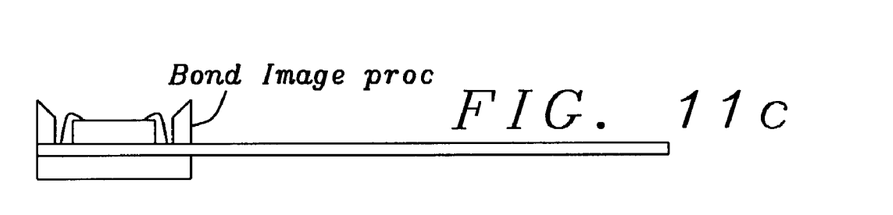
Figure 11D:
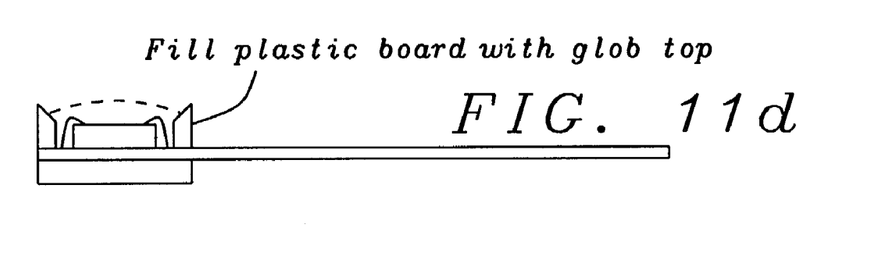

FIG. 10 shows a flowchart of a preferred method to manufacture said second embodiment of the miniature camera module invented. The first step 100 is to mount a PCB on a flexistrip, the next step 101 is to mount and glue an image sensor on said flexistrip, followed by a wire-bonding of said image processor die to said flexistrip in step 102. A plastic boarder is mounted and glued on said flexistrip in step 103. In step 104 said plastic boarder is filled with a glob top. Said PCB is flipped and an image sensor is mounted and glued on said PCB in step 105. In step 106 said sensor is wire-bonded to the PCB. Step 107 comprises the mounting and gluing of a lens holder on said PCB, followed by mounting a lens barrel and focusing of the lens contained in said lens barrel in step 108. Step 109 comprises electrical and optical tests of the camera module. In the last step 110 said lens barrel is glued to the lens holder FIG. 11a to 11d illustrate major steps of a modified method to manufacture the preferred embodiment of the invention described above. FIG. 11a illustrates how a flexistrip is mounted on a PCB. Contrary to the step shown in FIG. 9a a plastic stiffener is already integrated on the flexistrip prior to mounting on the PCB. Said stiffener has the same function as a separated plastic boarder. Said stiffener is a plastic part that is moulded onto the flexistrip. FIG. 11b shows how an image processor die is mounted and glued within said plastic boarder on the flexistrip on the opposite side of the PCB. FIG. 11c demonstrates how said image processor die is wire-bonded to the flexi-strip. FIG. 11d shows how said plastic boarder is filled with a glob top. The following steps are identical to the steps shown in FIG. 9f to 9h.

Figure 12:
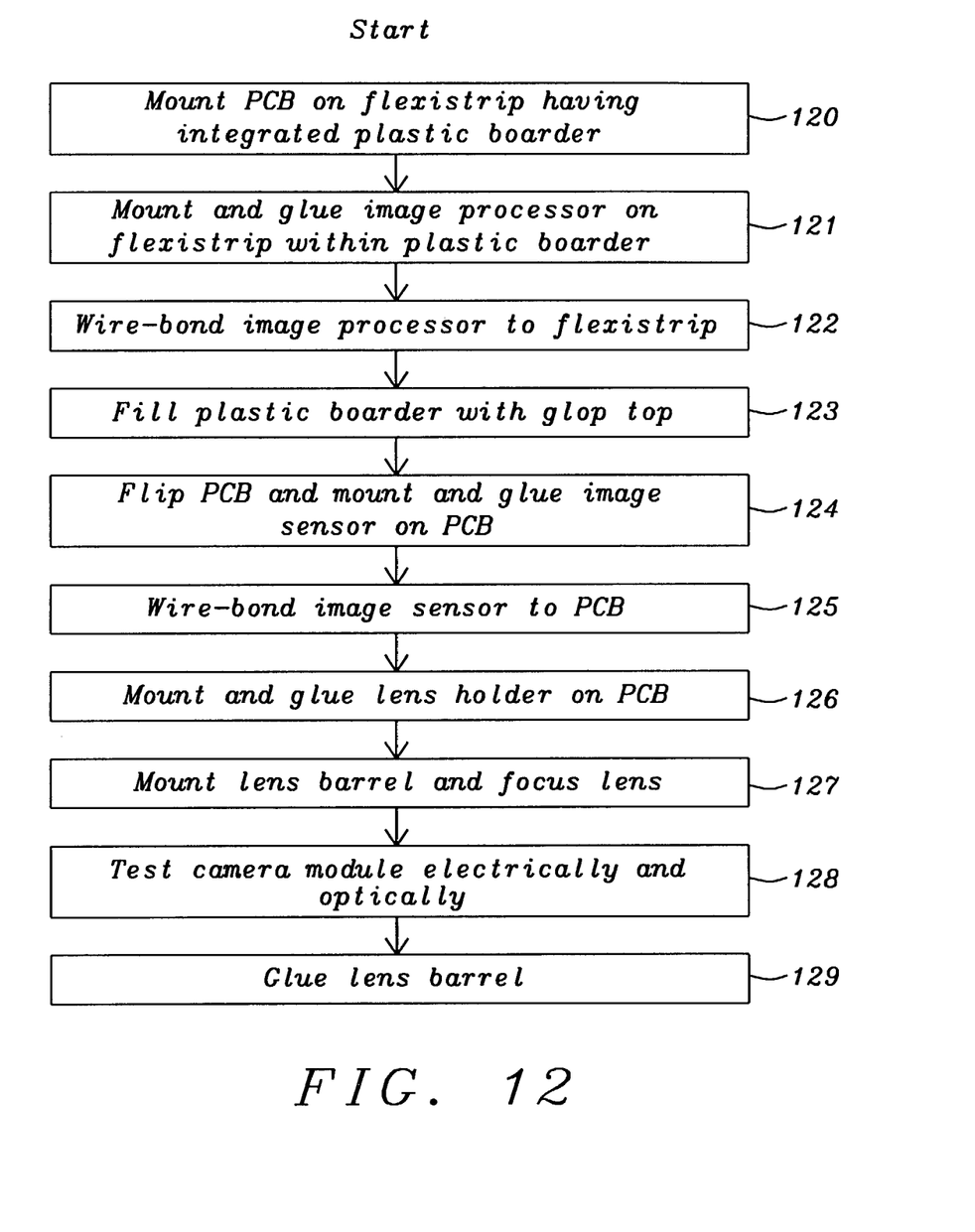
FIG. 12 shows a flowchart of an alternative method to manufacture the second embodiment of the camera module invented.

FIG. 12 shows a flowchart of a modified preferred method to manufacture said second embodiment of the miniature camera module invented. The essential difference to the method described in FIG. 10 is that said plastic boarder is integrated into said flexistrip prior to mounting on the PCB. This is described in the first step 120 where a PCB is mounted on a flexistrip having plastic boarder integrated, the next step 121 is to mount and glue an image processor on said flexistrip within said plastic boarder, followed by a wire-bonding of said image processor die to said flexistrip in step 122. In step 123 said plastic boarder is filled with a glob top. Said PCB is flipped and an image sensor is mounted and glued on said PCB in step 124. In step 125 said sensor is wire-bonded to the PCB. Step 126 comprises the mounting and gluing of a lens holder on said PCB, followed by mounting a lens barrel and focusing of the lens contained in said lens barrel in step 127. In step 128 electrical and optical tests of the camera module are performed. The last step 129 comprises to glue the lens barrel into the lens holder.

Figure 13A:
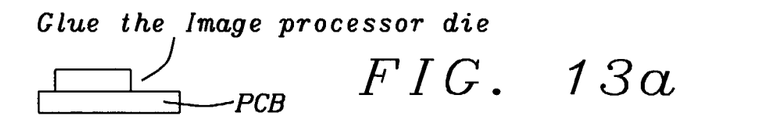
Figure 13B:
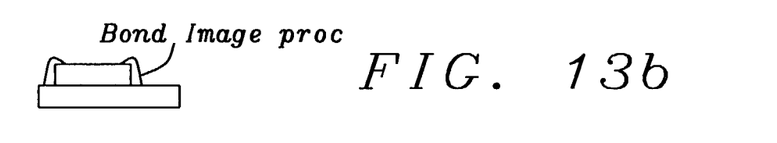
Figure 13C:
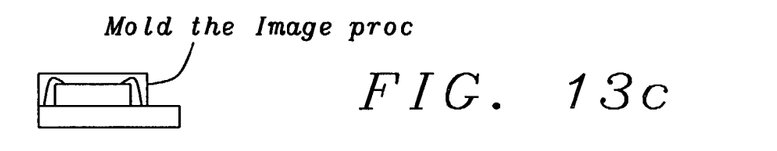
Figure 13D:
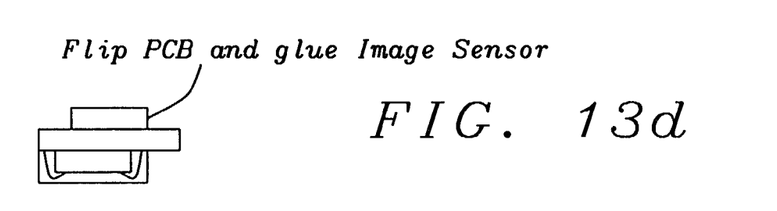
Figure 13E:
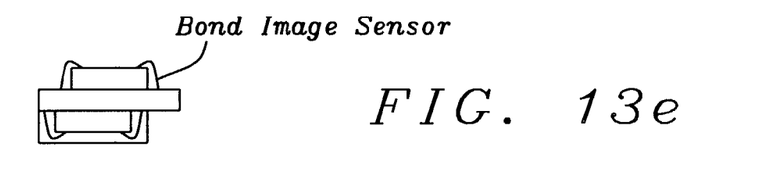
Figure 13F:
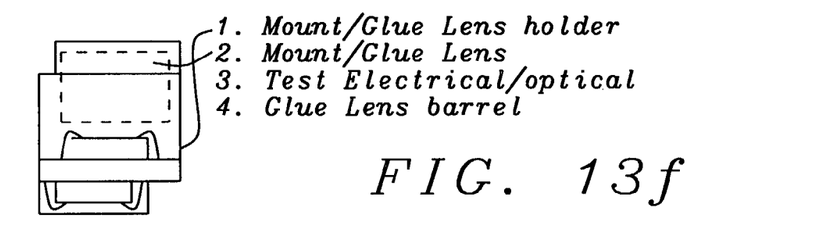
Figure 13G:
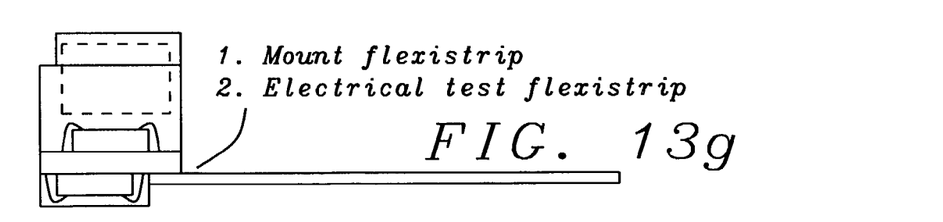

FIG. 13a to g illustrate major steps of another alternative method to manufacture the preferred embodiment of the invention described above. FIG. 13a illustrates how the image processor die is glued on the PCB. FIG. 13b shows how the image processor die is bonded to the PCB. FIG. 13c demonstrates how said image processor die is moulded with glob top using a plastic boarder. FIG. 13d shows how said PCB is flipped and an image sensor is glued on the opposite side of said PCB. FIG. 13e shows how image sensor is wire-bonded to said PCB. FIG. 13f demonstrates how the lens holder is mounted and glued, how the lenses are mounted and glued into the lens barrel and after the electrical and optical tests are completed the lens barrel is glued. FIG. 13g illustrates how the flexistrip is mounted and the electrical test of the flexistrip is performed.

Figure 14:
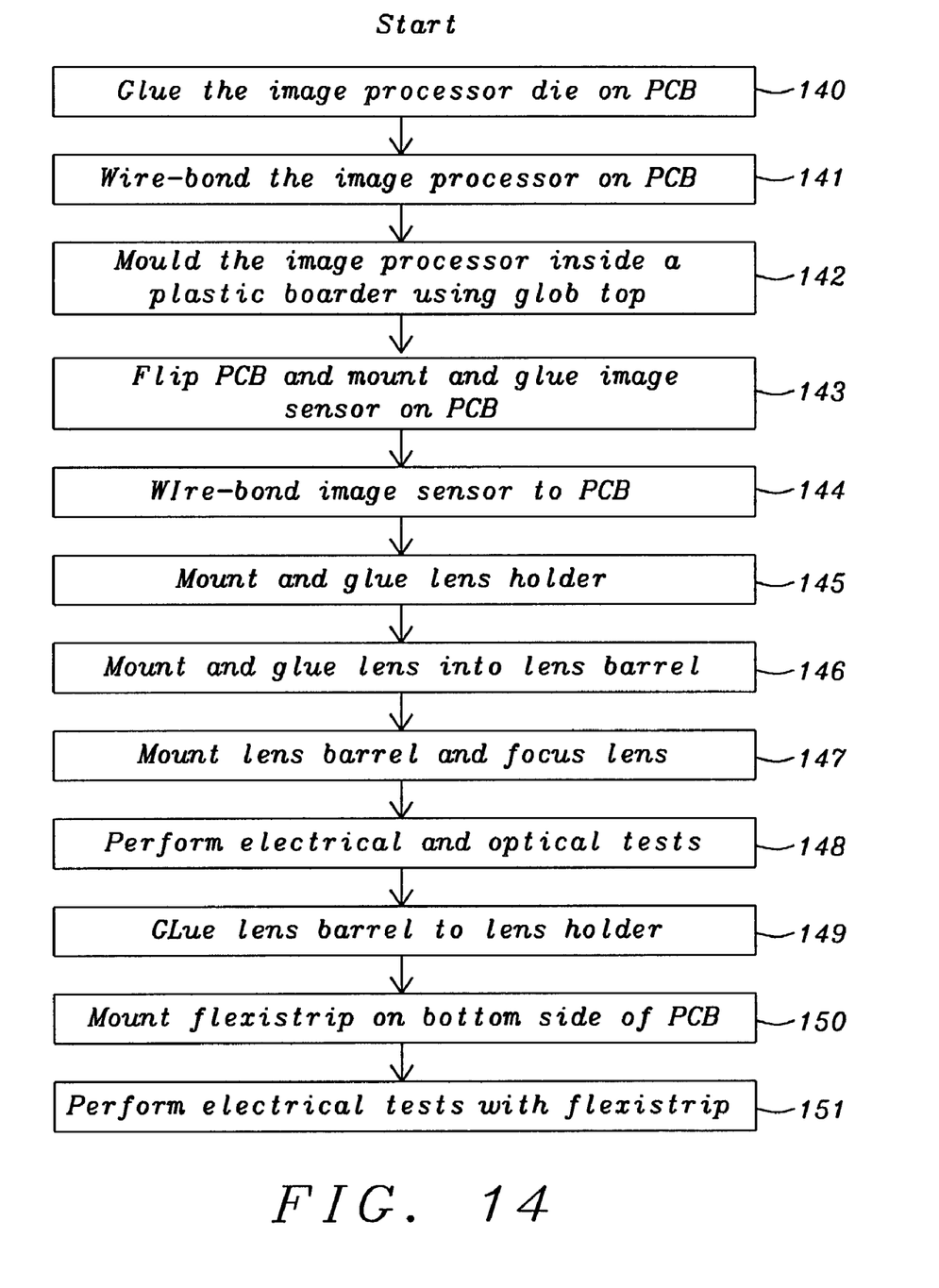
FIG. 14 shows a flowchart of another alternative method to manufacture the second embodiment of the camera module invented.

FIG. 14 shows a flowchart of another preferred method to manufacture said second embodiment of the miniature camera module invented. In the first step 140 the image processor die is glued on a PCB. The next step 141 describes that said image processor is wire-bonded on the PCB. In step 142 said image processor is moulded inside a plastic boarder using glob top. In the following step 143 the PCB is flipped and an image sensor die is mounted and glued on the opposite side of the PCB. In the next step 144 said image sensor is wire-bonded to the PCB, followed by step 145 wherein a lens holder is mounted and glued on the PCB. In the next step 146 the lens system is mounted and glued into a lens barrel followed by mounting said lens barrel into said lens holder and focusing said lens system in step 147. The following step 148 includes electrical and optical tests. If these test are successful the lens barrel is glued into the lens holder in step 149, the camera module is mounted on a flexistrip in step 150 and then additional electrical tests are performed in connection with said flexistrip in step 151.

While the invention has been particularly shown and described with reference to the preferred embodiments thereof, it will be understood by those skilled in the art that various changes in form and details may be made without departing from the spirit and scope of the invention.

What is claimed is:

1. A miniature camera module to be used as a built-in module in electronic devices comprising:
   a lens barrel comprising:
      means at the upper rim of said lens barrel to move said lens barrel into focus position;
      a means to hold said lens barrel in a focused position;
      a lens system; and
      an IR-cut filter;
   a lens holder system holding said lens barrel comprising:
      a means to fix said lens barrel in a focused position; and
      a housing;
   an image sensor chip having photon-receiving elements converting said photons into an image signal;
   a flexistrip;
   a printed circuit board (PCB) having a cavity wherein said image sensor chip is mounted; and
   an image processor, wherein a glob top is used to seal said image processor, wherein a plastic frame is shaping and limiting said glob top, and wherein said plastic frame is sloped to the inside on the top surface to hold said glob top.

2. The camera module of claim 1 wherein said electronic devices are hand-held devices.

3. The camera module of claim 2 wherein said hand-held devices are mobile phones.

4. The camera module of claim 2 wherein said hand-held devices are PDAs.

5. The camera module of claim 1 wherein said means at the upper rim of the lens barrel to move said lens system contained in the lens barrel into a focus position wherein any suitable grip can hold said lens barrel and move it.

6. The camera module of claim 1 wherein said means to hold said lens barrel in a focused position as part of said lens barrel is a thread applied to said lens barrel.

7. The camera module of claim 1 wherein said means to hold said lens barrel in a focused position as part of said lens barrel is a projecting jag applied to said lens barrel used to snap-in said lens barrel.

8. The camera module of claim 1 wherein said means to fix said lens barrel in a focused position is using glue out of a glue reservoir provided on said lens holder and wherein said glue is flowing from said glue reservoir to said means to hold said lens barrel through a glue groove provided on said lens holder.

9. The camera module of claim 1 wherein a cover glass can be added to said camera module.

10. The camera module of claim 9 wherein said cover glass can be snapped onto said lens holder.

11. The camera module of claim 1 wherein said housing is made out of a metal.

12. The camera module of claim 1 wherein said housing is made out of a polymer containing metal.

13. The camera module of claim 1 wherein said housing is made out of a polymer containing magnetite.

14. The camera module of claim 1 wherein said image sensor chip has been built using CMOS technology.

15. The camera module of claim 1 wherein said glob top is comprising two layers, wherein the first layer, covering directly said image processor is made of electrically isolating material and the second layer, applied on top of the first layer, is electrically conducting.

16. The camera module of claim 1 wherein said image processor is mounted on a flexistrip.

17. The camera module of claim 1 wherein said image processor is mounted on a PCB surrounded by a plastic boarder.

18. The camera module of claim 1 wherein said means to hold said lens barrel in a focused position is a lens grip holding said lens barrel using said means to move said lens barrel until the applied glue is cured.

19. The camera module of claim 1 wherein said lens holder system comprises a means to hold said lens barrel in a focused position.

20. The camera module of claim 19 wherein said means to hold said lens barrel in a focused position as part of said lens holder is a thread applied to said lens holder.

21. The camera module of claim 19 wherein said means to hold said lens barrel in a focused position as part of said lens holder is a dent applied to said lens holder used to snap-in said lens barrel.

22. A method to manufacture a miniature camera module to be used as a built-in module in electronic devices comprising:
   providing a flexistrip, a PCB, having a cavity, an image sensor chip, an image processor, a lens barrel comprising a lens system, means at the upper rim of said lens barrel to be used by a grip to move said lens barrel into a focus position, a means to hold that barrel, and an IR-cut filter, and a lens holder system comprising a means to hold said lens barrel in a focused position, a glue reservoir and a groove around said lens barrel to distribute the glue wherein said groove is directly connected to said glue reservoir and an area where said lens barrel can be glued to said lens holder, a means to fix said lens barrel in a focused position comprising a glue reservoir and a glue groove, and a housing;
   mount PCB on flexistrip;
   mount and glue image sensor in cavity of PCB; mount and glue image processor on PCB; wire-bond image processor and sensor to PCB;
   mount and glue lens holder on PCB;
   put glob top on image processor;
   mount and focus lens using said means to move said lens barrel;
   test camera module electrically and optically; and
   glue lens barrel comprising the steps of
      apply the glue into said glue reservoir;
      put pressure on said glue reservoir to guide the glue into said groove;
      check the performance of the glue distribution; and
      cure the glue.

23. The method of claim 22 wherein said glue has a low viscosity.

24. The method of claim 22 wherein said check of the performance is using a vision system.

25. The method of claim 22 wherein said check of the performance is limited to the potential detection of glue rests in said glue reservoir.

26. The method of claim 22 wherein said glue is colored.

27. The method of claim 22 wherein said glue is cured using UV-light.

* * * * *